United States Patent
Kwak (10) Patent No.: US 9,312,509 B2
(45) Date of Patent: Apr. 12, 2016

(54) ORGANIC LIGHT EMITTING DISPLAY DEVICE

(71) Applicant: Samsung Display Co., Ltd., Yongin (KR)

(72) Inventor: Won-Kyu Kwak, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/325,079

(22) Filed: Jul. 7, 2014

(65) Prior Publication Data

US 2015/0021573 A1  Jan. 22, 2015

(30) Foreign Application Priority Data

Jul. 22, 2013 (KR) .................. 10-2013-0085854

(51) Int. Cl.
| | | |
|---|---|---|
| H01L 27/32 | (2006.01) | |
| H01L 33/00 | (2010.01) | |
| H01L 21/00 | (2006.01) | |
| H01L 51/50 | (2006.01) | |
| H01L 51/52 | (2006.01) | |

(52) U.S. Cl.
CPC ........ *H01L 51/5246* (2013.01); *H01L 27/3253* (2013.01); *H01L 27/3276* (2013.01); *H01L 27/3244* (2013.01)

(58) Field of Classification Search
CPC ............ H01L 27/3253; H01L 27/3276; H01L 27/3244; H01L 51/5246

USPC ........ 257/40, 79, 99, 100, E21.502, E33.058, 257/E33.056, E33.059; 313/495, 504, 512; 438/26, 27, 127; 174/381, 521, 523
See application file for complete search history.

(56) References Cited

U.S. PATENT DOCUMENTS

| | | | |
|---|---|---|---|
| 6,717,052 B2* | 4/2004 | Wang et al. .................... | 174/381 |
| 8,390,194 B2* | 3/2013 | Choi ............................. | 313/512 |
| 8,803,184 B2* | 8/2014 | Lee et al. ........................ | 257/99 |
| 2007/0090759 A1* | 4/2007 | Choi et al. ..................... | 313/512 |
| 2007/0096622 A1* | 5/2007 | Yamada et al. ............... | 313/495 |
| 2010/0258346 A1* | 10/2010 | Chen et al. .................... | 174/521 |
| 2013/0300284 A1* | 11/2013 | Nishido ........................ | 313/511 |

FOREIGN PATENT DOCUMENTS

| | | |
|---|---|---|
| KR | 1020010084380 | 9/2001 |
| KR | 1020020051153 | 6/2002 |
| KR | 10-0712185 | 4/2007 |
| KR | 10-2009-0065116 | 5/2009 |
| KR | 10-2009-0121500 | 11/2009 |

\* cited by examiner

*Primary Examiner* — Dao H Nguyen
(74) *Attorney, Agent, or Firm* — H.C. Park & Associates, PLC (57) ABSTRACT

An organic light emitting display device includes a first substrate, a pixel array, metal patterns, a second substrate, and a frit. The pixel array is disposed on a first substrate. The metal patterns are arranged on the first substrate to surround the pixel array. The second substrate is disposed on the first substrate. The frit is disposed between the first substrate and the second substrate, the frit covering the metal patterns.

15 Claims, 6 Drawing Sheets

ORGANIC LIGHT EMITTING DISPLAY DEVICE

RELATED APPLICATIONS

This application claims priority to and the benefit of Korean Patent Application No. 10-2013-0085854, filed on Jul. 22, 2013, in the Korean Intellectual Property Office, which is hereby incorporated by reference for all purposes as if fully set forth herein.

BACKGROUND

1. Field

Exemplary embodiments of the present invention relate to an organic light emitting display device. More specifically, the exemplary embodiments of present invention relate to an organic light emitting display device in which its substrates are sealed with a frit.

2. Discussion of the Background

Organic light emitting display devices are next-generation display devices having a self-luminescent property. In general, organic light emitting display devices have excellent characteristics in terms of viewing angle, contrast, response speed, power consumption, etc., compared to liquid crystal display devices. Due to its self-luminescent property, organic light emitting display devices do not require a backlight; hence the organic light emitting display devices can be fabricated relatively light and thin.

In generally, an organic light emitting display device includes a substrate on which a pixel array is formed, and a container or encapsulating substrate disposed opposite to the substrate, which is bonded to the substrate by a sealant such as epoxy to encapsulate the pixel array.

The pixel array includes scan lines, data lines, and a plurality of pixels connected in a matrix form between the scan lines and the data lines. Each pixel may include an organic light emitting diode. The organic light emitting diode includes an anode, a cathode, and an organic thin film layer formed between the anode and cathode. The organic thin film layer may include an organic material, such as a hole transport layer, an organic emissive layer, and an electron transport layer.

SUMMARY

Exemplary embodiments of the present invention provide an organic light emitting display device designed to improve a bonding force between a frit and a substrate.

Exemplary embodiments of the present invention also provide a method of manufacturing an organic light emitting display device designed to improve a bonding force between a frit and a substrate.

Additional features of the invention will be set forth in the description which follows, and in part will be apparent from the description, or may be learned by practice of the invention.

An exemplary embodiment of the present invention discloses an organic light emitting display device comprising: a first substrate; a pixel array disposed on the first substrate; metal patterns disposed on the first substrate to surround the pixel array; a second substrate disposed on the first substrate; and a frit disposed between the first substrate and the second substrate, the frit covering the metal patterns.

An exemplary embodiment of the present invention also discloses a method for manufacturing an organic light emitting display device, the method comprising: forming a pixel array on a first substrate; forming metal patterns on the first substrate to surround the pixel array; disposing a frit on the first substrate, the frit covering the metal patterns; disposing a second substrate opposite to the first substrate, overlapping with the pixel array, the metal patterns, and the frit; and bonding the frit to the first substrate and the second substrate to seal the pixel array.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF ILLUSTRATED EMBODIMENTS

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Figure 1:
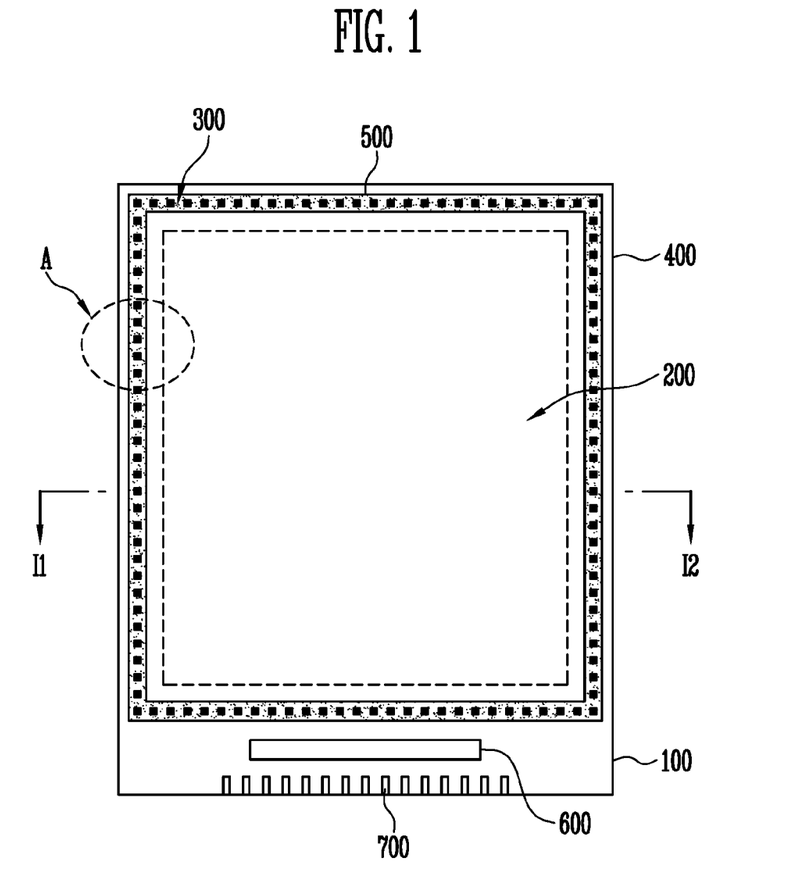
FIG. 1 is a plan view illustrating an organic light emitting display device according to this embodiment of the present invention.
Figure 2:
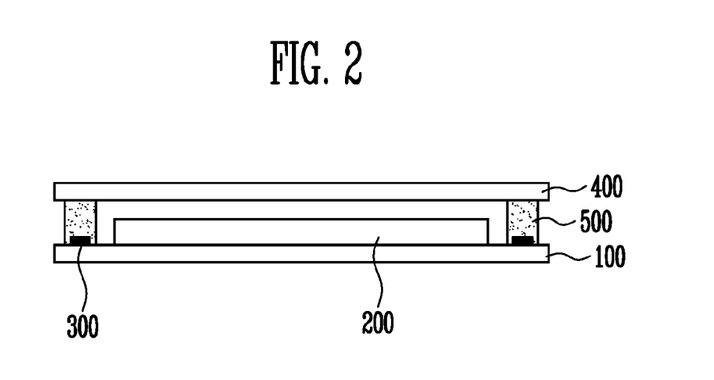
FIG. 2 is a sectional view taken along line I1-I2 of FIG. 1.

FIG. 1 is a plan view illustrating an organic light emitting display device according to this embodiment of the present invention. FIG. 2 is a sectional view taken along line I1-I2 of FIG. 1.

Referring to FIGS. 1 and 2, the organic light emitting display device includes a first substrate 100 having a pixel array 200 formed thereon, metal patterns 300 arranged on the first substrate 100 to surround the pixel array 200, a second substrate 400 disposed on the first substrate 100 to overlap with the pixel array 200 and the metal patterns 300, and a frit 500 disposed between the first substrate and the second substrate 400, the frit covering the metal patterns 300.

A driving circuit 600 and a pad portion 700 may be formed on the first substrate 100 outside the area surrounded by the frit 500. The driving circuit 600 may be configured to drive the pixel array 200. The pad portion 700 may be electrically connected to an external circuit to transmit an input signal to the driving circuit 600.

The first substrate 100 is formed in the shape of a thin film, and may be made of, for example, a glass, plastic, or metal.

The pixel array 200 may constitute a display unit configured to display image.

The second substrate 400 is disposed opposite to the first substrate 100, configured to seal the pixel array 200. In a front light emitting structure, the second substrate 400 may be made of a transparent material such as glass or plastic. In a rear light emitting structure, the second substrate 400 may be made of an opaque material.

The frit 500 is disposed between the first and second substrates 100 and 400 to surround the pixel array 200. The frit 500 is bonded to the first and second substrates 100 and 400 so that an internal space including the pixel array 200 is sealed.

The metal patterns 300 are disposed on the first substrate 100 to surround the pixel array 200. The metal patterns 300 are spaced apart from each other. The metal patterns 300 are interposed between the frit 500 and the first substrate 100.

Figure 3:
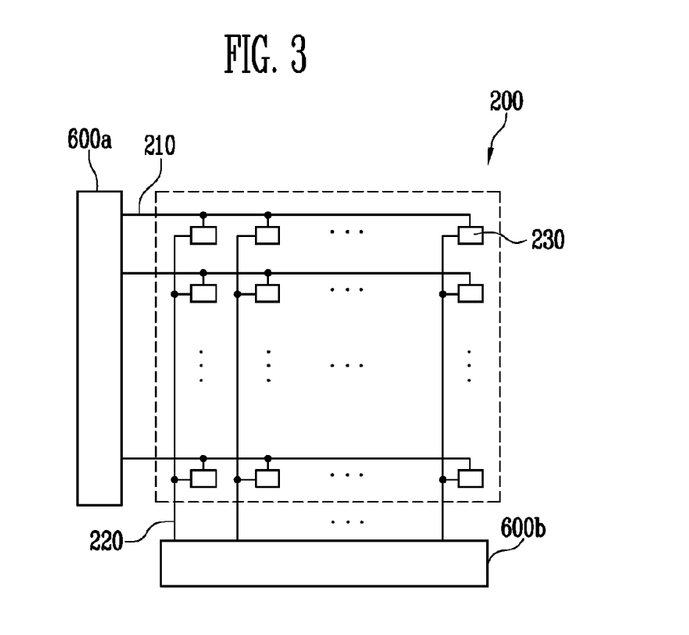
FIG. 3 is a plan view illustrating a pixel array of FIG. 1.

Referring to FIG. 3, the pixel array 200 includes a plurality of scan lines 210 arranged in one direction, a plurality of data lines 220 arranged to intersect the scan lines 210, and a plurality of pixels 230 connected to the scan lines 210 and the data lines 220. The pixel 230 is a light-emitting device, which may include an organic light emitting diode.

The driving circuit 600 may include a scan driving circuit 600a connected to the plurality of scan lines 210, and a data driving circuit 600b connected to the plurality of data lines 220. The scan driving circuit 600a and the data driving circuit 600b may be implemented, for example, by an integrated circuit (IC).

Figure 4:
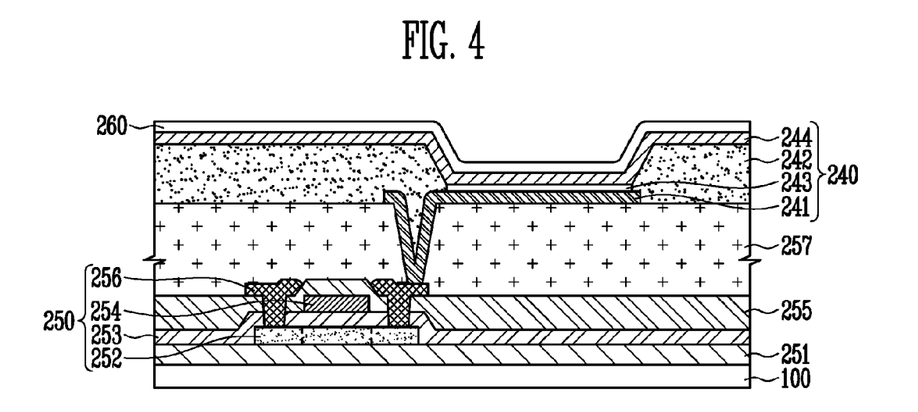
FIG. 4 is a sectional view illustrating a pixel array of FIG. 1.

Referring to FIG. 4, an organic light emitting diode 240 includes a first electrode 241, a second electrode 244, and an organic thin-film layer 243 interposed between the first and second electrodes 241 and 244. The organic thin-film layer 243 is formed on the first electrode 241 within a light emitting region, defined by an opening in a pixel defining layer 242. The organic thin-film layer may include a hole injection layer, a hole transport layer, an organic emissive layer, an electron transport layer, and an electron injection layer.

The organic light emitting diode may further be connected to a thin film transistor configured to transmit a signal, and a capacitor configured to maintain the transmitted signal.

Referring to FIG. 4, a thin film transistor 250 includes a semiconductor layer 252 configured a source region, a drain region, and a channel regions, a gate electrode 254 insulated from the semiconductor layer 252 by a gate insulating layer 253, and a source or drain electrode 256 electrically connected to the semiconductor layer 252 in the source or drain region through a contact hole formed in an insulation layer 255 and the gate insulating layer 353. A planarization insulating layer 257 is disposed between the thin film transistor 250 and the organic light emitting diode 240. A buffer layer 251 may be disposed between the thin film transistor 250 and the base substrate 100.

A protective layer 260 may be formed on the first substrate 100 including the pixel array 200 to protect the organic light emitting diode 240. The protective layer 260 may be formed of an inorganic material to prevent the penetration of moisture or oxygen, and sustain against physical pressure. The protective layer 260 may also be either a single-layered or multi-layered structure.

Figure 5A:
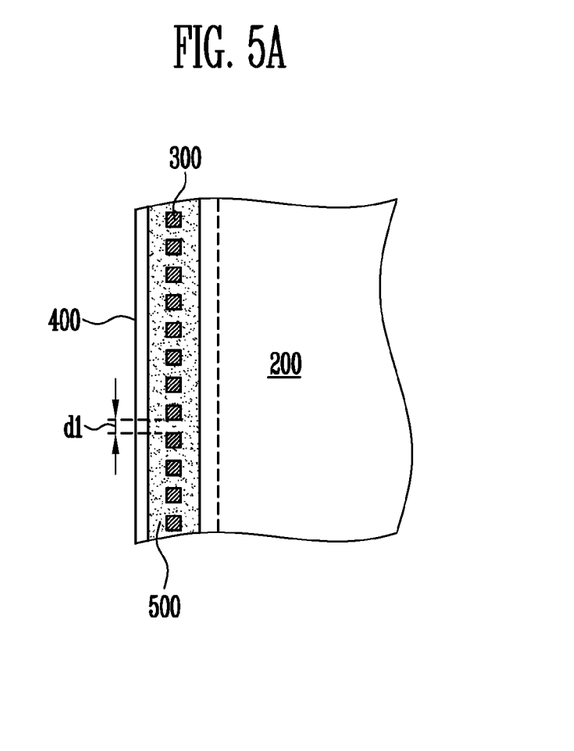
FIG. 5A is an enlarged plan view of portion A of FIG. 1.
Figure 5B:
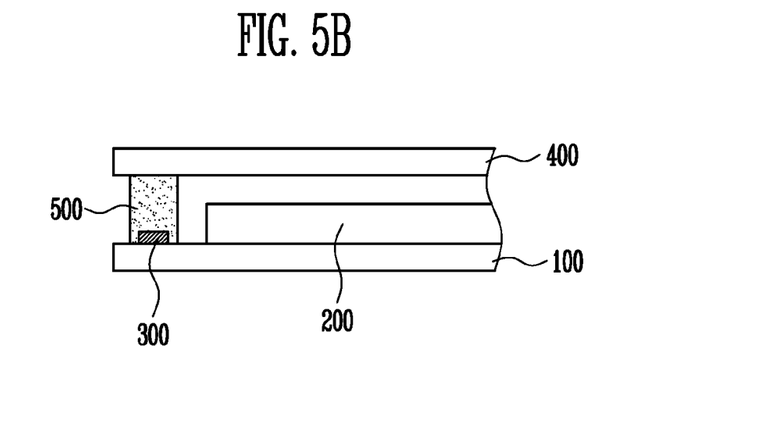
FIG. 5B is an enlarged sectional view of portion A of FIG. 1.

FIGS. 5A and 5B are plan and sectional views illustrating an embodiment of the metal patterns 300, showing an enlarged portion A of FIG. 1.

Referring to FIGS. 5A and 5B, the metal patterns 300 may be arranged in a line and equally spaced apart from each other. For example, the distance d1 between the metal patterns 300 may be set to about 30 μm or more. According to an exemplary embodiment, the metal patterns 200 may be spaced apart from each other by about 30 μm to about 100 μm.

Figure 6A:
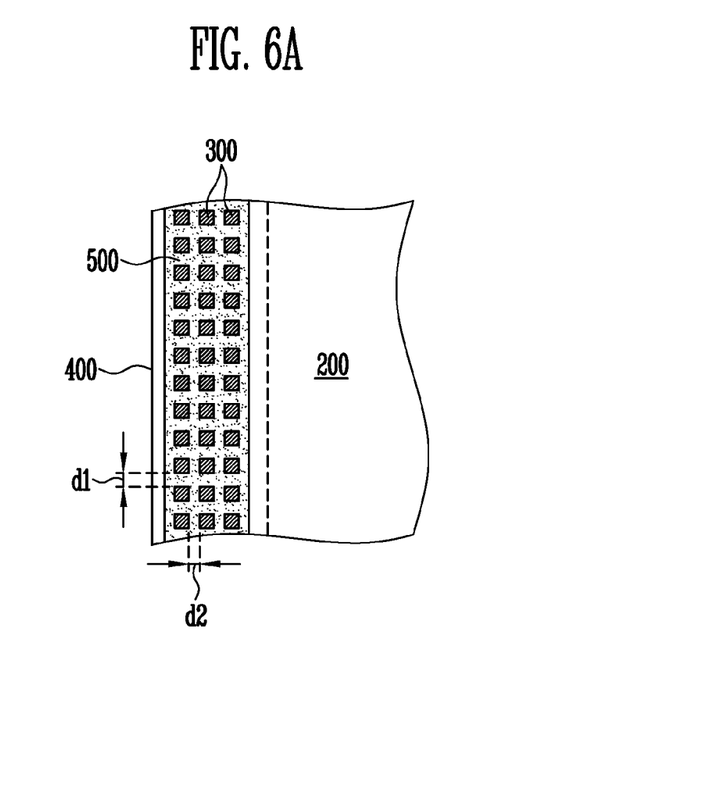
FIG. 6A is an enlarged plan view of portion A of FIG. 1.
Figure 6B:
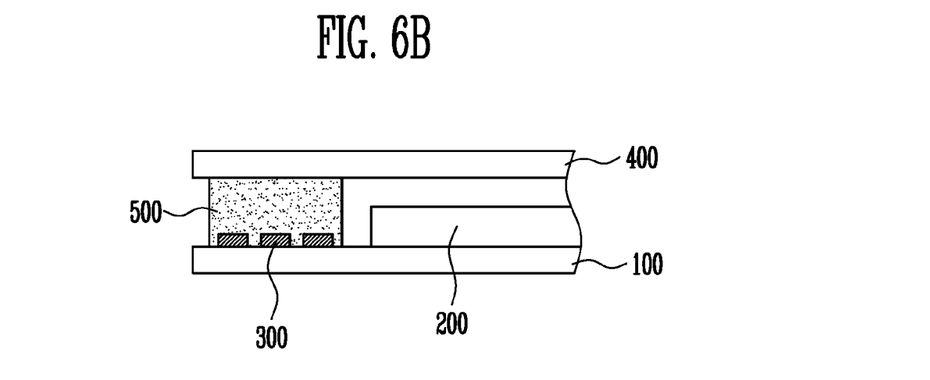
FIG. 6B is an enlarged sectional view of portion A of FIG. 1.

FIGS. 6A and 6B are plan and sectional views illustrating another exemplary embodiment of the metal patterns 300, showing an enlarged portion A of FIG. 1.

Referring to FIGS. 6A and 6B, the metal patterns 300 may be arranged in three lines and spaced apart from each other. For example, the distance d1 between the metal patterns 300 and the distance d2 between the lines may be set to about 30 μm or more. According to an exemplary embodiment, the distances d1 and d2 may each be in a range of about 30 μm to about 100 μm. The distances d1 and d2 need not equal each other.

Present invention is not limited to the above exemplary embodiments of the metal patterns 300. The plurality of metal pattern 300 may be arranged in any number of plural lines according to the size of the area sealed by the frit 500. The metal patterns 300 may be formed in a polygonal shape such as, but not limited to, a triangular, quadrangular or pentagonal shape. The metal patterns 300 may also be formed in a circular shape.

In an exemplary embodiment, the pixel array 200 may be sealed between the first substrate and the second substrate with the frit 500, by radiating laser or infrared light onto the frit 500 from a rear surface of the second substrate 400. As the frit 500 absorbs the radiated laser or infrared light, the frit 500 may melt from the heat generated from the laser or infrared light, and bond to the first and second substrates 100 and 400.

In an exemplary embodiment, the laser or infrared light radiated onto the frit 500 may be reflected and diffused on the metal patterns 300. The reflection and diffusion of the radiated laser or infrared light may uniformly increase the temperature of the entire section of the frit 500, so that the entire section of the frit 500 may uniformly bond to the first substrate 100 and the second substrates 400.

In general, the energy of laser or infrared light has a Gaussian distribution. Therefore, a direct radiation of the laser or infrared light to the frit 500 will generate inconsistent heat distribution on the frit, and result in poor bonding of the two substrates 100 and 400. This poor bonding of the substrates from inconsistent heat distribution may be overcome by the metal patterns 300 of the exemplary embodiment, which reflect and diffuse the laser or infrared light to melt the frit and bond the substrates uniformly.

Similar effect may be obtained by a linear metal strip design instead of the metal patterns 300 of current exemplary embodiment of the invention. However, the linear metal strip design may be weak against electrostatic discharge. The substrate of the organic light emitting display device is made of glass or the like; hence the electrostatic discharge may be frequently generated during the fabrication or application of the organic light emitting display device. Since the metal patterns 300 are peripherally disposed surrounding the two substrates 100 and 400, the metal patterns 300 may be directly influenced by the electrostatic discharge, which may exfoliate the metal patterns or destroy the frit 500 sealing. The issue of the electrostatic discharge may be overcome by designing metal patterns 300 in the form of independent islands, preventing the potential electrostatic discharge from conducting along the metal patterns 300, thus minimizing the Joule's heat and the electrostatic discharge towards the pixel array.

In one exemplary embodiment, the distance d1 between the metal patterns 300 and the distance d2 between the lines may be set to 30 μm or more, for example about 30 μm to about 100 μm. In a case where the distances d1 and d2 are set to less than 30 μm, it may be difficult to prevent damage caused by the electrostatic discharge. In a case where the distances d1 and d2 are set to more than 100 μm, it may be difficult to obtain the effect caused by the reflection and diffusion of the laser or infrared light.

Figure 7A:
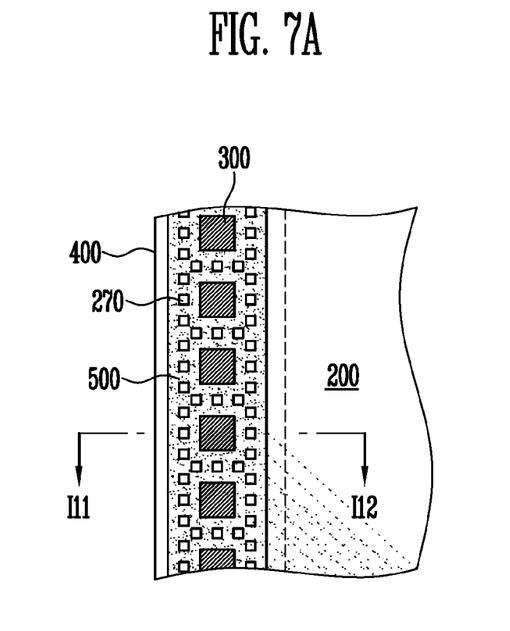
FIG. 7A is a plan view illustrating an organic light emitting display device according to one embodiment of the present invention.
Figure 7B:
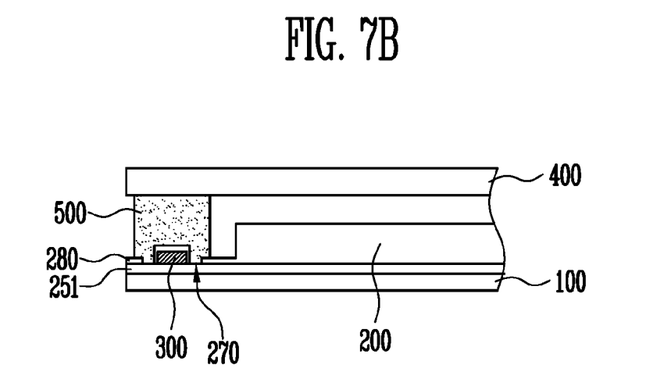
FIG. 7B is a sectional view taken along line I11-I12 of FIG. 7A.

FIGS. 7A and 7B are plan and sectional views illustrating an organic light emitting display device according to an exemplary embodiment of the present invention.

Referring to FIGS. 7A and 7B, an insulating layer 280 is interposed between a first substrate 100 including metal patterns 300 and a frit 500. Holes 270 are formed in the insulating layer 280 to surround each metal pattern 300.

The frit 500 may flow into the holes 270 during the process of melting the frit 500 by laser or infrared light, and directly bond to the first substrate 100. The holes 270 may increase the bonding surface area of the frit 500 to the insulating layer 280 and the first substrate 100.

Referring to FIGS. 4, 7A, and 7B, when the gate electrode 254 or the source or drain electrode 256 is formed in the process of fabricating the thin film transistor 250, the metal patterns 300 may be formed of the same material, e.g., at least one of aluminum (Al), titanium (Ti), and molybdenum (Mo). The insulating layer 280 may be formed into a single- or multi-layered structure in the process of forming the gate insulating layer 253, the insulation layer 255, and the protective layer 260.

In an exemplary embodiment, a buffer layer 251 may be formed on the first substrate 100, and the metal patterns 300 may then be formed on the buffer layer 251, electrically insulating the metal patterns 300 from one another. The buffer layer 251 may be formed with a silicon oxide layer ($SiO_2$), silicon nitride layer ($SiN_x$), or laminated structure thereof.

Figure 8A:
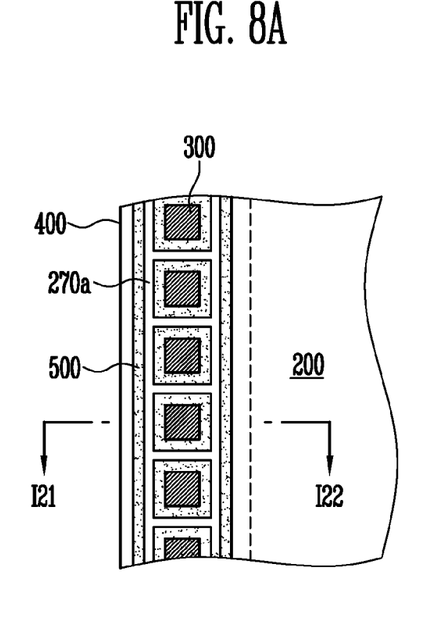
FIG. 8A is a plan view illustrating an organic light emitting display device according to one embodiment of the present invention.
Figure 8B:
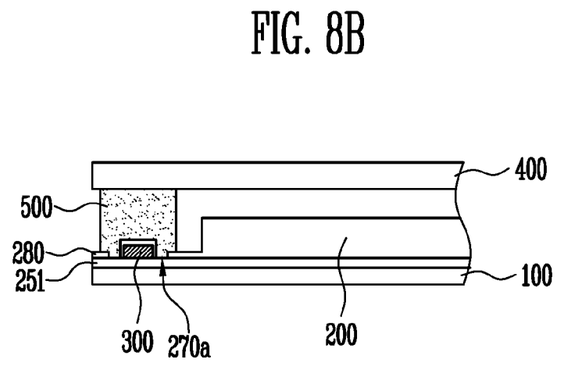
FIG. 8B is a sectional view taken along line I21-I22 of FIG. 8A.

FIGS. 8A and 8B are plan and sectional views illustrating an organic light emitting display device according to an exemplary embodiment of the present invention.

Referring to FIGS. 8A and 8B, an insulating layer 280 is interposed between a first substrate 100 including metal patterns 300 and a frit 500. A trench 270a is formed in the insulating layer 280 to surround each metal pattern 300.

The trench 270a has a structure in which the holes 270 shown in FIGS. 7A and 7B are connected to one another, further increasing the bonding surface area of the frit 500 to the insulating layer 280 and the first substrate 100 compared to the structure of FIGS. 7A and 7B.

In one exemplary embodiment, the buffer layer 251 may be formed on the first substrate 100, electrically insulating the metal patterns 300. The buffer layer 251 may be formed with a silicon oxide layer ($SiO_2$), silicon nitride layer ($SiN_x$), or laminated structure thereof.

Although the exemplary embodiments discussed above disclose metal patterns 300 disposed on the first substrate 100, the metal patterns 300 of FIGS. 5-8 may alternatively be disposed on the second substrate 400. Furthermore, in other exemplary embodiments, metal patterns 300 may be disposed on both the first substrate 100 and the second substrate 400.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic light emitting display device, comprising:
   a first substrate;
   a pixel array disposed on the first substrate;
   metal patterns disposed on the first substrate to surround the pixel array;
   a second substrate disposed on the first substrate;
   a frit disposed between the first substrate and the second substrate, the frit covering the metal patterns; and
   an insulating layer disposed between the frit and the first substrate, the insulating layer comprising holes surrounding each metal pattern,
   wherein the frit is disposed in the holes of the insulating layer.

2. The organic light emitting display device of claim 1, wherein the metal patterns are arranged in plural lines.

3. The organic light emitting display device of claim 2, wherein the distance between the metal patterns and the distance between the lines are each in a range of about 30 to about 100 μm.

4. The organic light emitting display device of claim 1, wherein the metal patterns have a polygonal shape.

5. The organic light emitting display device of claim 1, wherein the insulating layer comprises a multi-layered structure.

6. The organic light emitting display device of claim 1, wherein the metal patterns comprise at least one of aluminum (Al), titanium (Ti), and molybdenum (Mo).

7. The organic light emitting display device of claim 1, further comprising a buffer layer disposed between the metal pattern and the first substrate.

8. A method for manufacturing an organic light emitting display device, the method comprising:
   forming a pixel array on a first substrate;
   forming metal patterns on the first substrate to surround the pixel array;
   disposing a frit on a second substrate, the frit corresponding to the metal patterns;
   disposing the second substrate opposite to the first substrate; and
   bonding the frit to the first substrate and the second substrate to seal the pixel array, comprising:
      radiating laser or infrared light onto the metal patterns from a rear surface of the second substrate; and
      melting the frit by reflecting and diffusing the radiated laser or infrared light on the metal patterns.

9. The method of claim 8, further comprising:
   forming, before disposing the frit on the second substrate, an insulating layer on the metal patterns; and
   forming holes in the insulating layer surrounding each metal pattern.

10. The method of claim 9, wherein the bonding of the frit further comprises:

radiating laser or infrared light onto the frit from a rear surface of the second substrate; and melting the frit by reflecting and diffusing the radiated laser or infrared light on the metal patterns.

11. The method of claim 10, further comprising forming a buffer layer on the first substrate, the pixel array being disposed on the buffer layer.

12. The method of claim 8, further comprising:

forming, before disposing the frit on the second substrate, an insulating layer on the metal patterns; and forming a trench in the insulating layer surrounding each metal pattern.

13. The method of claim 12, wherein the bonding of the frit further comprises:

radiating laser or infrared light onto the frit from a rear surface of the second substrate; and melting the frit by reflecting and diffusing the radiated laser or infrared light on the metal patterns.

14. The method of claim 13, further comprising forming a buffer layer on the first substrate, the pixel array being disposed on the buffer layer.

15. An organic light emitting display device, comprising:

a first substrate;

a pixel array disposed on the first substrate;

metal patterns disposed on the first substrate to surround the pixel array;

a second substrate disposed on the first substrate;

a frit disposed between the first substrate and the second substrate, the frit covering the metal patterns; and an insulating layer disposed between the frit and the first substrate, the insulating layer comprising a trench surrounding each metal pattern, wherein frit is disposed in the trench of the insulating layer.

* * * * *